United States Patent
Lee et al.

(10) Patent No.: US 7,088,168 B2
(45) Date of Patent: Aug. 8, 2006

(54) DIRECT CONVERSION RECEIVER USING VERTICAL BIPOLAR JUNCTION TRANSISTOR AVAILABLE IN DEEP N-WELL CMOS TECHNOLOGY

(75) Inventors: Kwyro Lee, Yuseong-gu (KR); Ilku Nam, Seoul (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 57 days.

(21) Appl. No.: 10/504,366

(22) PCT Filed: Jul. 11, 2003

(86) PCT No.: PCT/KR03/01383

§ 371 (c)(1),
(2), (4) Date: Aug. 12, 2004

(87) PCT Pub. No.: WO2004/008650

PCT Pub. Date: Jan. 22, 2004

(65) Prior Publication Data

US 2005/0087813 A1 Apr. 28, 2005

(30) Foreign Application Priority Data

Jul. 12, 2002 (KR) .................. 10-2002-0040821

(51) Int. Cl.
*G06G 7/12* (2006.01)
(52) U.S. Cl. .................... 327/355; 438/309
(58) Field of Classification Search ........... 327/355, 327/356, 357, 358, 359; 257/378, 367, 357, 257/370; 438/309, 318, 202
See application file for complete search history.

(56) References Cited

U.S. PATENT DOCUMENTS

| 6,093,613 | A | 7/2000 | Verma et al. | 430/309 |
| 6,177,325 | B1 | 1/2001 | Jang | 438/318 |
| 6,249,031 | B1 | 6/2001 | Verma et al. | 257/378 |
| 6,583,661 | B1 * | 6/2003 | Tanji et al. | 327/355 |
| 6,794,730 | B1 * | 9/2004 | Kim et al. | 257/565 |

FOREIGN PATENT DOCUMENTS

| EP | 0267768 A1 | 5/1988 |
| KR | 10-2000-0032519 A | 6/2000 |

* cited by examiner

*Primary Examiner*—Linh My Nguyen

(74) *Attorney, Agent, or Firm*—Shinjyu Global IP Counselors, LLP

(57) ABSTRACT

This invention is about the direct conversion receiver. It is excellent the receiving sensitivity that DC off-set, matching characteristics of the relationship of I/Q circuits and noise characteristics are improved. In order to achieve this purpose, the direct conversion receiver uses vertical bipolar junction transistor available in standard triple-well CMOS technology in the switching element of mixer and base-band analog circuits. Furthermore, as using the passive mixer in the other practical example of this invention, this invention controls the occurrence of 1/f noise. As using the vertical bipolar junction transistor available in standard triple-well CMOS in the base-band analog circuits, this invention realizes the direct conversion receiver that DC off-set, matching characteristics of the relationship of I/Q circuit and noise characteristics are improved.

32 Claims, 8 Drawing Sheets

DIRECT CONVERSION RECEIVER USING VERTICAL BIPOLAR JUNCTION TRANSISTOR AVAILABLE IN DEEP N-WELL CMOS TECHNOLOGY

FIELD OF THE INVENTION

The present invention relates to a communication system. In particular, the invention is directed to a direct conversion receiver having high sensitivity where DC offset, matching characteristic between I/Q circuits and noise characteristic are improved.

TECHNICAL BACKGROUND

A direct conversion receiver is being studied very actively as one of receivers for embodying single chip. The direct conversion receiver can reduce the number of outer devices such as a filter and can relieve burden of digital signal processing. Thus, it is the most suitable device for manufacturing a single chip using CMOS process where digital circuit can be easily conceived. The direct conversion receiver comprises a RF direct conversion receiver for converting RF (Radio Frequency) signal into base-band and an IF direct conversion receiver for converting RF signal into IF (Intermediate Frequency) signal and for converting the RF signal into base-band.

FIG. 1 shows a block diagram of a conventional vector RF direct conversion receiver embodied in CMOS process.

As shown in FIG. 1, the vector RF direct conversion receiver comprises a band pass filter (101), a low noise amplifier (103), a phase conversion device (105), first and second active mixers (107, 109), and base-band analog circuit (111). Low noise amplifier (103), first and second active mixers (107, 109) and base-band analog circuit (111) are embodied by CMOS process. The direct conversion receiver shown in FIG. 1 outputs two vector base-band signals of I and Q as a result of mixing radio frequency signal with phase local oscillating signal and quadrature phase local oscillating signal.

FIG. 2 shows a block diagram of a conventional vector IF direct conversion receiver embodied in CMOS process.

As shown in FIG. 2, the vector IF direct conversion receiver comprises a band pass filter (201), a low noise amplifier (203), a first active mixer (205), a phase conversion device (207), a second and a third active mixer (209, 211) and base-band analog circuit (213). Low noise amplifier (203), first, second and third active mixers (205, 209, 211) and base-band analog circuit (213) are embodied by CMOS process. The IF direct conversion receiver shown in FIG. 2 converts radio frequency signal into intermediate frequency signal by first active mixer (205), which is converted into two vector base-band signals of I and Q to be outputted.

FIG. 3 shows a circuit diagram of a typical mixer embodied using CMOS Gilbert cell in the direct conversion receiver shown in FIGS. 1 and 2.

As shown in FIG. 3, the mixer comprises an amplifying unit (3100) and a mixing unit (3300). Amplifying unit (3100) comprises amplifying device MA31 and amplifies the inputted signal. Mixing unit (3300) comprises a first and second switching devices MS31 and MS32; mixes an input signal and local oscillating signal LO; and outputs a signal corresponding to the frequency difference between the two signals. In the conventional CMOS direct conversion receiver, the amplifying device MA31, first and second switching devices MS31 and MS32 are embodied with MOS devices.

The conventional direct conversion receiver is difficult to be embodied as an integrated circuit because of DC offset due to local oscillator leakage and mismatching between I/Q circuits. In particular, the following problems exist in the event that the direct conversion receiver is embodied only in CMOS process as shown in FIG. 1.

First, there are additional DC offset and system noise figure degradation due to mis-matching between MOS devices and l/f noise within devices. In particular, the first and second switching devices MS31 and MS32 shown in FIG. 3 and MOS device used in base-band analog circuits (111), all of which output low frequency base-band signal, are significant causes for the above problems. These problems cannot be resolved completely. Wide-band wireless system can resolve the problem to some extent by use of high pass filer. However, in narrow-band system wherein signal bandwidth is less than l/f noise corner frequency, there are severe degradation of noise ratio with respect to signal and severe reduction in system dynamic range. Further, the circuit cannot operate completely as result of saturation.

Second, mismatching between the signal paths of I and Q occurs due to mis-matching between MOS devices. This causes degradation of noise ratio with respect to signal.

Bipolar junction transistor (BJT) has good matching characteristic between devices compared with the MOS devices and has l/f noise less than 1/100 l/f noise of MOS devices. Thus, the bipolar junction transistor can resolve the DC offset and system noise characteristic degradation due to l/f noise to a great extent. Thus, a direct conversion receiver using BiCMOS process, where CMOS devices and BJT devices are integrated together, was developed. The direct conversion receiver using BiCMOS process has improved DC offset and l/f noise characteristic compared with the receiver using MOS process. However, it is expensive and it takes long time to develop the receiver. Further, digital circuit performance is very bad compared with the receiver using CMOS process. Thus, the direct conversion receiver using BiCMOS process is disadvantageous in embodying a single chip.

On the other hand, a research has been conducted for resolving the problems of the MOS devices using side BJT available only in the CMOS process or vertical parasitic BJT. However, the BJT devices have very bad operation frequency performance compared with the MOS device, thereby limiting its use in DC circuits such as bandgap reference. In particular, the side BJT has a disadvantage in matching characteristic between devices compared with vertical BJT.

DETAILED DESCRIPTION OF THE INVENTION

The object of the present invention is to provide a direct conversion receiver has improved DC offset, matching characteristic between I/Q signals and l/f noise characteristic.

Another object of the present invention is to provide a direct conversion receiver that is usable in applications having narrow transceiving bandwidth.

In order to achieve the objects, a direct conversion receiver of one embodiment of the present invention comprises a band pass filter for filtering a predetermined band of received signal; a low noise amplifier for amplifying the signal passing said band pass filter; an active mixer for mixing the signal outputted from said low noise amplifier with local oscillating signal and outputting scalar base-band signal; and a base-band analog circuit for filtering base-band signal outputted from said active mixer and amplifying the signal. The active mixer is embodied with vertical BJT embodied in three layers-well CMOS process having deep n-well; The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. Further, the low noise amplifier can be embodied with vertical BJT embodied in CMOS process having deep n-well which has emitter formed in n+ source-drain diffusion of said CMOS process; base formed in p-well of said CMOS process and p+ source-drain diffusion; and collector formed in deep n-well of said CMOS process, n-well and n+ source-drain diffusion. The base-band analog circuit may employ MOS transistor embodied in CMOS process. Further, the base-band analog circuit is embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion.

A direct conversion receiver according to other embodiment of the present invention comprises a band pass filter for filtering a predetermined band of received signal; a low noise amplifier for amplifying the signal passing said band pass filter; a phase conversion device being applied local oscillating signal for outputting same-phase local oscillating signal and vertical phase local oscillating signal; a first and second active mixers for mixing the signal outputted from said low noise amplifier with same-phase local oscillating signal outputted from said phase conversion device and vertical-phase local oscillating signal and outputting same-phase base-band vector signal and vertical base-band vector signal, respectively; and a base-band analog circuit for filtering base-band signal outputted from said first and second active mixer and amplifying the signal. The active mixers is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. Further, the low noise amplifier may be embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion. The base-band analog circuit may employ MOS transistor embodied in CMOS process. Further, the circuit is embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion.

A direct conversion receiver according to another embodiment of the present invention comprises a band pass filter for filtering a predetermined band of received signal; a low noise amplifier for amplifying the signal passing said band pass filter; a first active mixer for mixing signal outputted from said low noise amplifier with first local oscillating signal and outputting intermediate frequency signal; a second active mixer for mixing the intermediate frequency signal outputted from said first active mixer with second local oscillating signal and outputting base-band scalar signal; and a base-band analog circuit for filtering base-band signal outputted from said second active mixer and amplifying the signal. The second active mixer is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. Further, the low noise amplifier may be embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion. The base-band analog circuit may employ MOS transistor embodied in CMOS process. Further, the analog circuit may be embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion.

A direct conversion receiver according to still other embodiment of the present invention comprises a band pass filter for filtering a predetermined band of received signal; a low noise amplifier for amplifying the signal passing said band pass filter; a first active mixer for mixing signal outputted from said low noise amplifier with first local oscillating signal and outputting intermediate frequency signal; a phase conversion device being applied second local oscillating signal for outputting same-phase local oscillating signal and vertical-phase local oscillating signal; a second and third active mixers for mixing the intermediate frequency signal outputted from said first active mixer with the same-phase local oscillating signal outputted from said phase conversion device and the vertical-phase local oscillating signal and outputting same-phase base-band vector signal and vertical-phase base-band vector signal; and a base-band analog circuit for filtering base-band signal outputted from said second active mixer and amplifying the signal. The second and third active mixers are embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. Further, the low noise amplifier may be embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion. The base-band analog circuit may employ MOS transistor embodied in CMOS process. Further, the base-band analog circuit may be embodied with vertical BJT embodied in CMOS process having deep n-well, which has emitter formed in n+ source-drain diffusion of said CMOS process; base formed in p-well of said CMOS process and p+ source-drain diffusion; and collector formed in deep n-well of said CMOS process, n-well and n+ source-drain diffusion.

A direct conversion receiver according to still other embodiment of the present invention comprises a band pass filter for filtering a predetermined band of received signal; a low noise amplifier for amplifying the signal passing said band pass filter; an passive mixer for converting radio frequency signal outputted from said low noise amplifier to base-band scalar signal; and a base-band analog circuit for filtering base-band signal outputted from said passive mixer and amplifying the signal. The circuit is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. The passive mixer may be embodied in CMOS process.

A direct conversion receiver according to still other embodiment of the present invention comprises a band pass filter for filtering a predetermined band of received signal; a low noise amplifier for amplifying the signal passing said band pass filter; a phase conversion device being applied local oscillating signal for outputting same-phase local oscillating signal and vertical-phase local oscillating signal; a first and second passive mixers for mixing radio frequency signal outputted from said low noise amplifier with the same-phase local oscillating signal and the vertical-phase local oscillating signal and outputting same-phase base-band vector signal and vertical-phase base-band vector signal, respectively; and a base-band analog circuit for filtering base-band signal outputted from said first and second passive mixers and amplifying the signal. The circuit is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. The passive mixer may be embodied in CMOS process.

A direct conversion receiver according to still other embodiment of the present invention comprises a band pass filter for filtering a predetermined band of received signal; a low noise amplifier for amplifying the signal passing said band pass filter; a first active mixer for mixing radio frequency signal outputted from said low noise amplifier with first local oscillating signal and outputting intermediate frequency signal; a second passive mixer for mixing the intermediate frequency signal outputted from said first active mixer with second local oscillating signal and outputting base-band scalar signal; and a base-band analog circuit for filtering base-band signal outputted from said first and second passive mixers and amplifying the signal. The circuit is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier may employ MOS transistor embodied in CMOS process. The passive mixer may be embodied in CMOS process.

A direct conversion receiver according to still other embodiment of the present invention comprises a band pass filter for filtering a predetermined band of received signal; a low noise amplifier for amplifying the signal passing said band pass filter; a first active mixer for mixing radio frequency signal outputted from said low noise amplifier with first local oscillating signal and outputting intermediate frequency signal; a phase conversion device being applied second local oscillating signal for outputting same-phase local oscillating signal and vertical-phase local oscillating signal; a second and third passive mixers for mixing the intermediate frequency signal outputted from said first active mixer with the same-phase base-band vector signal and vertical-phase local oscillating signal outputted from said phase conversion device and outputting same-phase base-band vector signal and vertical-phase base-band signal, respectively; and a base-band analog circuit for filtering base-band signal outputted from said first and second passive mixers and amplifying the signal. The circuit is embodied with vertical BJT embodied in three layers-well CMOS process having deep n-well. The BJT has emitter formed in n+ source-drain process of said CMOS process; base formed in p-well of said CMOS process and p+ source-drain diffusion; and collector formed in deep n-well of said CMOS process, n-well and n+ source-drain diffusion. The low noise amplifier employs MOS transistor embodied in CMOS process. The passive mixer is embodied in CMOS process.

BEST MODE FOR CARRYING OUT THE INVENTION

In the following, the embodiments of the present invention will be described with reference to the accompanied drawings.

Figure 1:
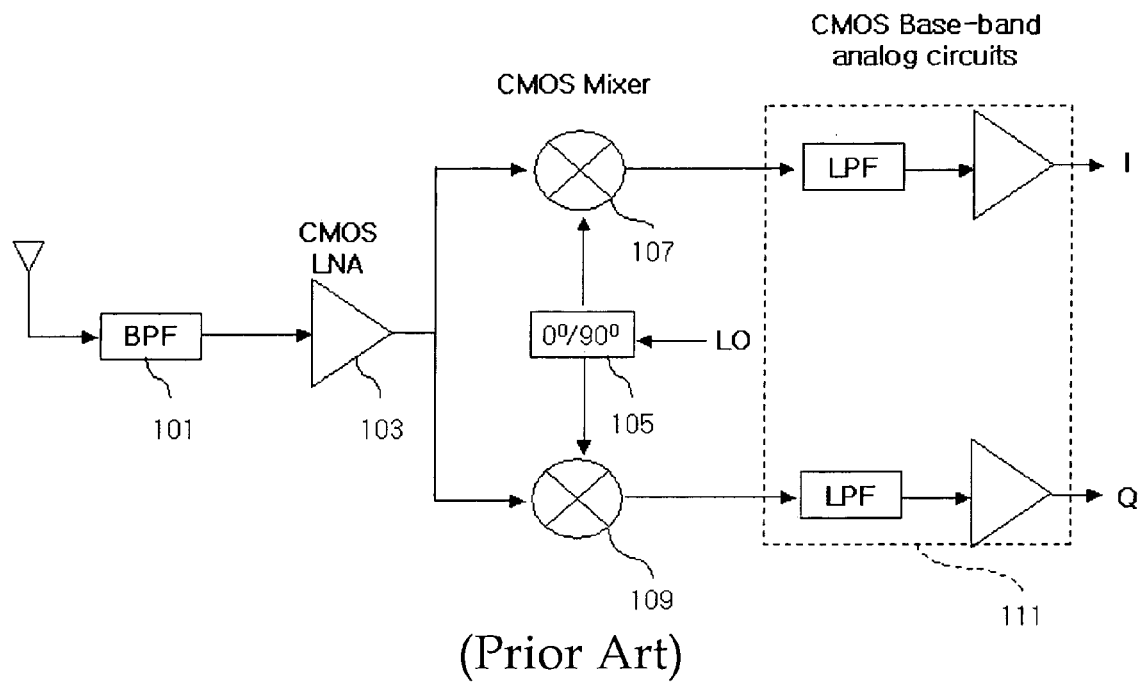
FIG. 1 shows a block diagram of a conventional vector RF direct conversion receiver using CMOS process.
Figure 2:
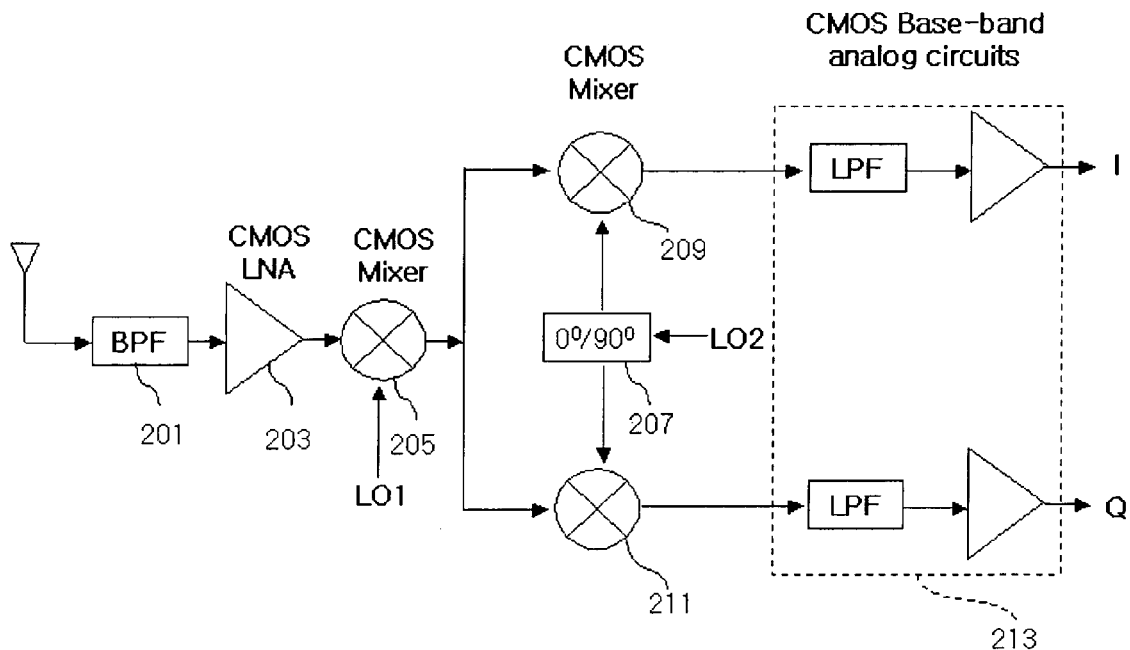
FIG. 2 shows a block diagram of a conventional vector IF direct conversion receiver using CMOS process.
Figure 3:
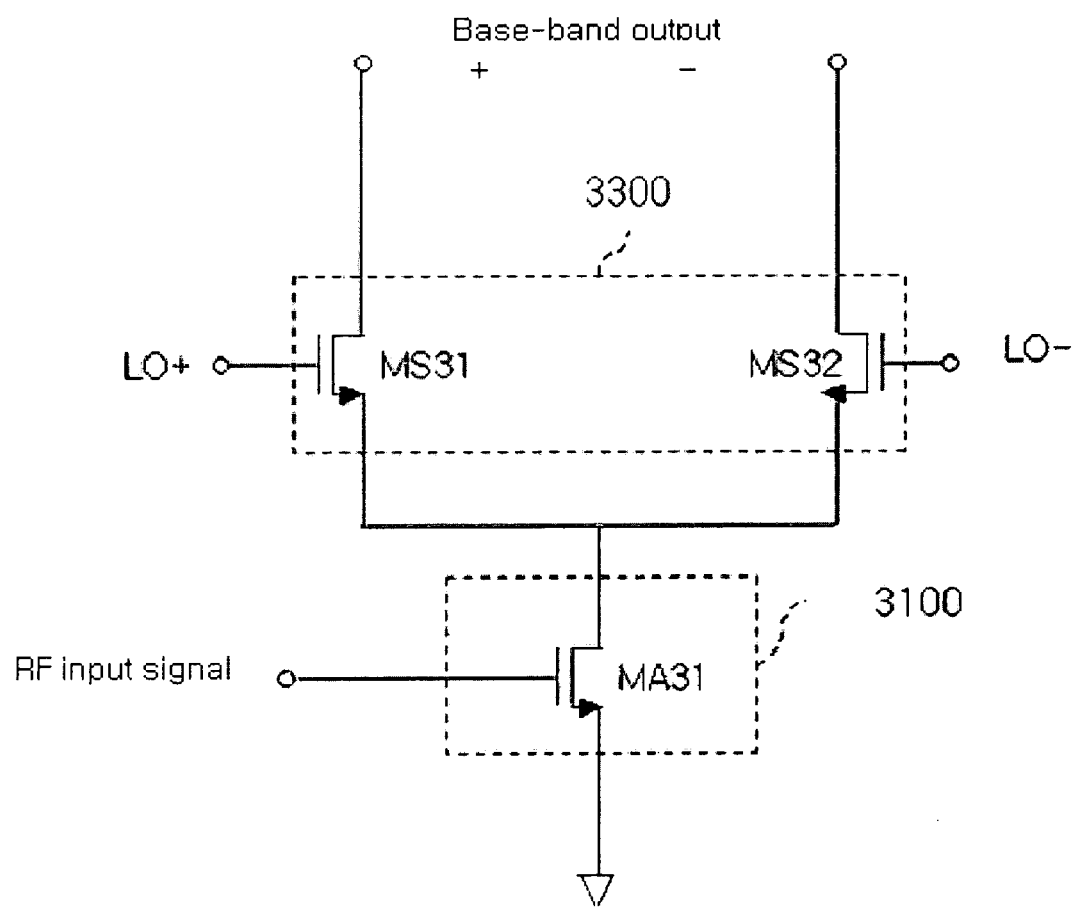
FIG. 3 shows a circuit diagram of a typical mixer embodied using CMOS Gilbert cell in the direct conversion receiver shown in FIGS. 1 and 2.
Figure 4:
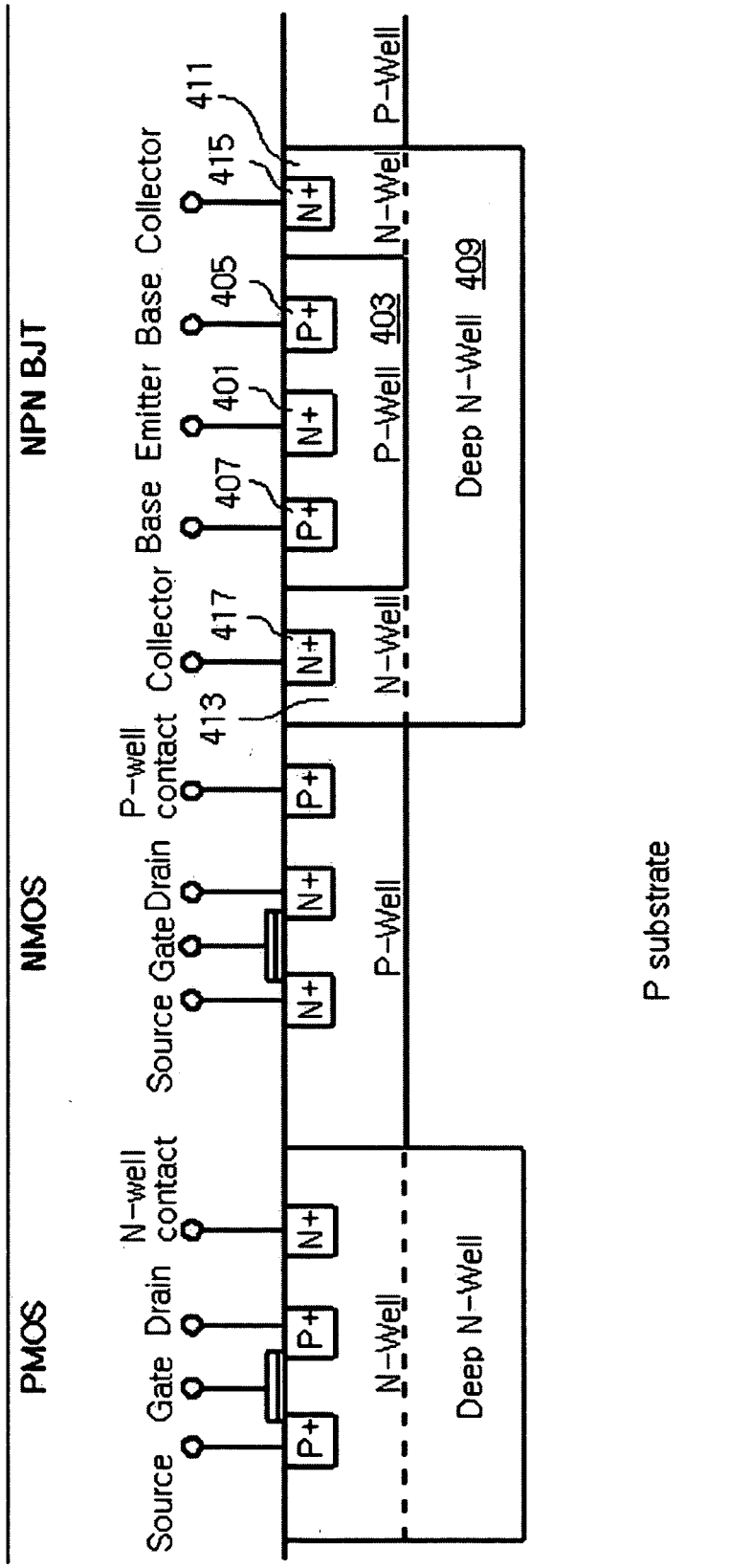
FIG. 4 shows a cross-sectional view of PMOS transistor embodied in standard 3 layers-well CMOS process, NMOS transistor and deep n-well vertical NPN BJT.

FIG. 4 shows a cross-sectional view of PMOS transistor embodied in standard 3 layers-well CMOS process, NMOS transistor and deep n-well vertical NPN BJT.

The standard 3 layers-well CMOS process and PMOS transistor and NMOS transistor which are embodied using the process are well known in the related field and thus, the explanation is not described herein.

As shown in FIG. 4, 3 layers-well CMOS process having deep n-well can achieve vertical BJT having good performance. n+ source-drain diffusion (401) of CMOS process forms emitter; p-well (403) and p+ contact (405, 407) form base; and deep n-well (409), n-well (411, 413) and n+ source-drain diffusion (415, 417) form collector. The vertical BJT embodied using deep n-well CMOS process has a high frequency performance that is sufficient to be used in one or more GHz circuit. Further, the devices are separated one another. Thus, it can be adaptable in high speed integrated circuit. In addition, 1/f noise is very low compared with MOS transistor due to the natural characteristic of BJT. Further, the matching characteristic between devices is good. Thus, it is very useful for various analog signal processing circuit. The performance becomes good as the concentration of deep n-well (409) increases; as the depth of p-well (403) decreases; and as design rule of CMOS become smaller.

Figure 5:
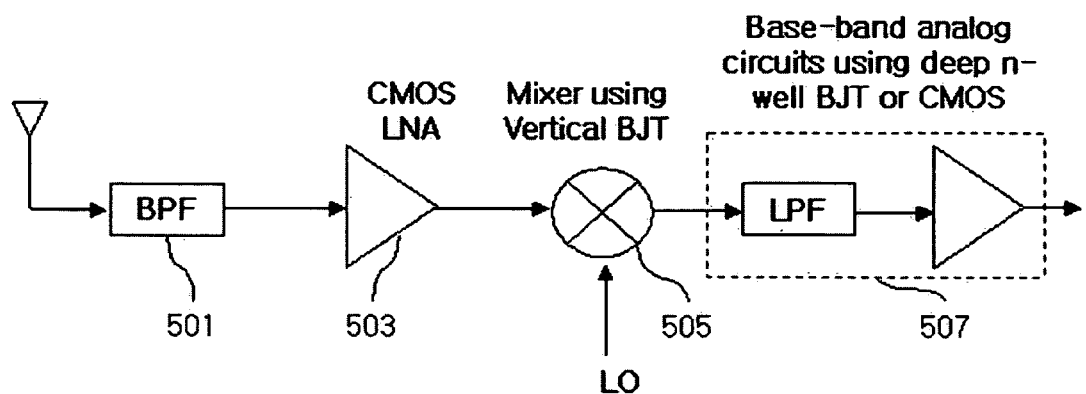
FIG. 5 shows a block diagram of scalar RF direct conversion receiver according to an embodiment of the present invention using the vertical BJT shown in FIG. 4.

FIG. 5 shows a block diagram of scalar RF direct conversion receiver according to an embodiment of the present invention using the vertical BJT shown in FIG. 4. The direct conversion receiver shown in FIG. 5 obtains one scalar base-band signal by mixing radio frequency signal with local oscillating signal LO.

As shown in FIG. 5, the direct conversion receiver comprises band pass filter (501), low noise amplifier (503), active mixer (505) and base-band analog circuits (507).

Band pass filter (501) filters a predetermined band of the received signal. Low noise amplifier (503) amplifies the signal filtered by band pass filter (501) and is embodied by CMOS process. In CMOS process, the characteristic of NMOS transistor has best performance; PMOS transistor has second best performance; and NPN BJT has third best performance. Thus, it is preferred that the low noise amplifier is embodied with NMOS transistor. However, the spirit of the present invention is not limited to the embodiment wherein low noise amplifier (503) is embodied with NMOS transistor. The amplifier may be embodied with PMOS transistor and vertical BJT.

Active mixer (505) converts the received radio frequency signal to base-band signal. That is, the mixer mixes the signal amplified by low noise amplifier (503) with the local oscillating signal LO generated in local oscillator (not shown) and outputs base-band scalar signal having a frequency corresponding to the frequency difference between the two signals. Active mixer (505) may be embodied with vertical BJT.

Base-band analog circuit (507) comprises a low pass filter and amplifier. The circuit filters base-band signal outputted from active mixer (505) and amplifies it. Base-band analog circuit (507) may be embodied with vertical bipolar junction transistor or MOS transistor. Alternatively, the circuit can be embodied with combination of them.

Figure 6:
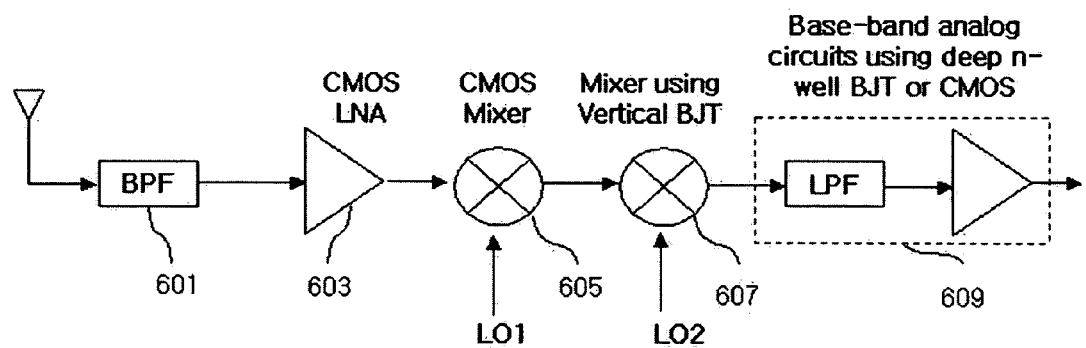
FIG. 6 shows a block diagram of scalar IF direct conversion receiver according to an embodiment of the present invention using the vertical BJT shown in FIG. 4.

FIG. 6 shows a block diagram of scalar IF direct conversion receiver according to an embodiment of the present invention using the vertical BJT shown in FIG. 4. The IF direct conversion receiver shown in FIG. 6 differs from the direct conversion receiver shown in FIG. 5 in that it comprises first mixer (605) embodied with CMOS and second mixer (607) embodied with vertical BJT and in that first and second local oscillating signals LO1 and LO2 are applied in first and second mixers (605, 607), respectively. First mixer (605) mixes radio frequency signal amplified by low noise amplifier (603) with the first local oscillating signal LO1 and converts it to intermediate frequency signal. Second mixer (607) mixes the intermediate frequency signal with the second local oscillating signal LO2 and converts it to base-band scalar signal. Preferably, IF filter which filters IF-band signal is provided between first mixer (605) and second mixer (607).

Figure 7:
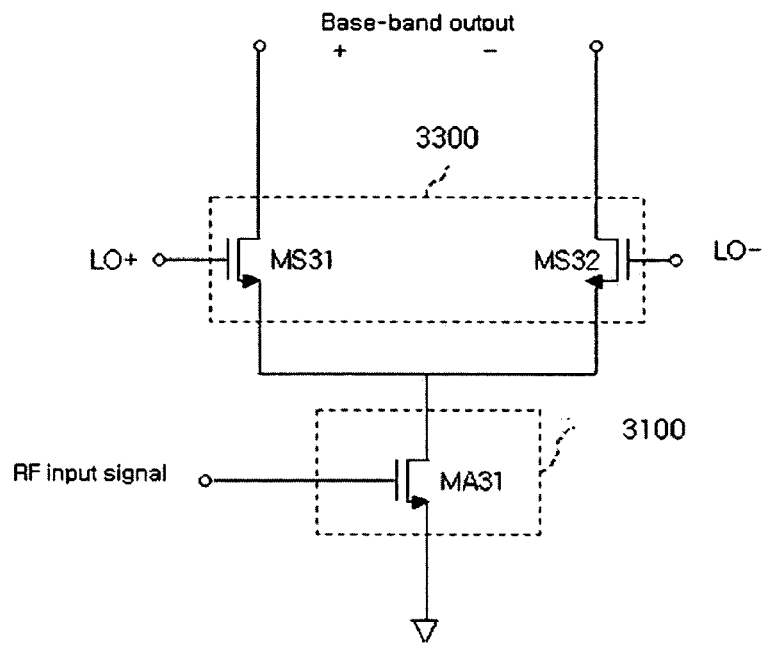
FIG. 7 shows a circuit diagram of an active mixer using Gilbert cell according to an embodiment of the present invention in the direct conversion receiver shown in FIGS. 5 and 6.

FIG. 7 shows a circuit diagram of an active mixer using Gilbert cell according to an embodiment of the present invention in the direct conversion receiver shown in FIGS. 5 and 6.

As shown in FIG. 7, the active mixer comprises amplifying unit (7100) and mixing unit (7300). Amplifying unit (7100) comprises amplifying unit MA71 and amplifies the input voltage signal to current signal. Mixing unit (7300) comprises the first and second switching devices MS71 and MS72. The mixing unit mixes the input signal with local oscillating signal LO and outputs the base-band signal corresponding to the frequency difference between the two signals.

In one embodiment of the active mixer, the amplifying device MA71 of amplifying unit (7100) is embodied with MOS transistor having good high frequency performance. That is, it is preferred that the amplifying device MA71 of the amplifying unit is embodied with NMOS transistor since NMOS transistor has best performance in CMOS process as described in the above. On the other hand, the first and second switching devices MS71 and MS72 which have problems of 1/f noise and DC offset are embodied with vertical BJT having low 1/f noise and good matching characteristic between devices. The mixer embodied as described in the above can be a radio frequency receiving apparatus having improved noise characteristic without affecting high frequency characteristic greatly. However, amplifying unit (7100) may not be provided depending upon kind of mixer. The mixer without amplifying unit also falls within the scope of the present invention.

Figure 8:
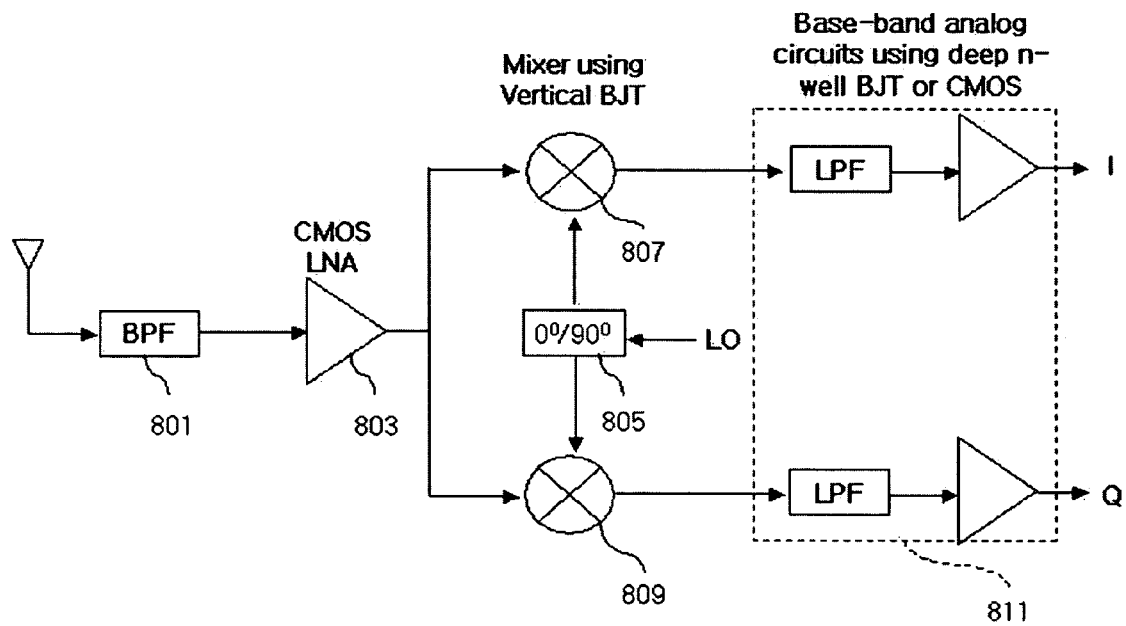
FIG. 8 shows a block diagram of a vector RF direct conversion receiver according to another embodiment of the present invention using the vertical BJT shown in FIG. 4.

FIG. 8 shows a block diagram of a vector RF direct conversion receiver according to another embodiment of the present invention using the vertical BJT shown in FIG. 4.

As shown in FIG. 8, the vector direct conversion receiver of the present invention differs from the scalar direct conversion receiver shown in FIG. 5 in that it further comprises phase conversion device (805) and first and second active mixer (807, 809).

In the following, will be described the constitution of the direct conversion receiver of another embodiment of the present invention and operations thereof. However, the explanation to band pass filter (801) and low noise amplifier (803) is not described since they are same as described in the above.

Phase conversion device (805) inputs local oscillating signal LO; converts it to same-phase local oscillating signal and vertical-phase oscillating signal; and outputs them to first and second mixer (807, 809), respectively.

First and second active mixer (807, 809) mixes the signal amplified by low noise amplifier (803) with the same-phase local oscillating signal outputted from phase conversion device (805) and the vertical-phase local oscillating signal, respectively and outputs to first and second mixer (807, 809).

First and second active mixer (807, 809) mixes the signal amplified by low noise amplifier (803) with the same-phase local oscillating signal outputted from phase conversion device (805) and the vertical-phase local oscillating signal, and outputs them as the same-phase base-band vector signal I and the vertical-phase base-band vector signal Q. In the direct conversion receiver of one embodiment of the present invention, first and second active mixer (807, 809) is embodied with vertical BJT embodied in deep n-well CMOS process as shown in FIG. 7. That is, the amplifying device MA71 is embodied with NMOS transistor having high performance and the first and second switching device MS71 and MS72 outputting base-band signal is embodied with vertical MJT.

Base-band analog circuit (811) comprises low pass filter and amplifier and the like. The circuit filters the same-phase base-band signal I outputted from first and second active mixer (807, 809) and vertical-phase base-band signal Q and amplifies them. In the direct conversion receiver of one embodiment of the present invention, base-band analog circuit (811) can be embodied with vertical BJT or MOS transistor. Alternatively, the circuit can be embodied with their combination.

As described in the above, noise and I/Q mis-matching caused in the mixing process of received signal and local oscillating signal can be resolved in the event that, as shown in FIG. 8, the switching device of first and second mixer (807, 809) used in vector receiver is embodied with vertical BJT that is embodied in n-well CMOS process, since BJT has good matching characteristic between devices and has very low 1/f noise compared with MOS transistor.

Figure 9:
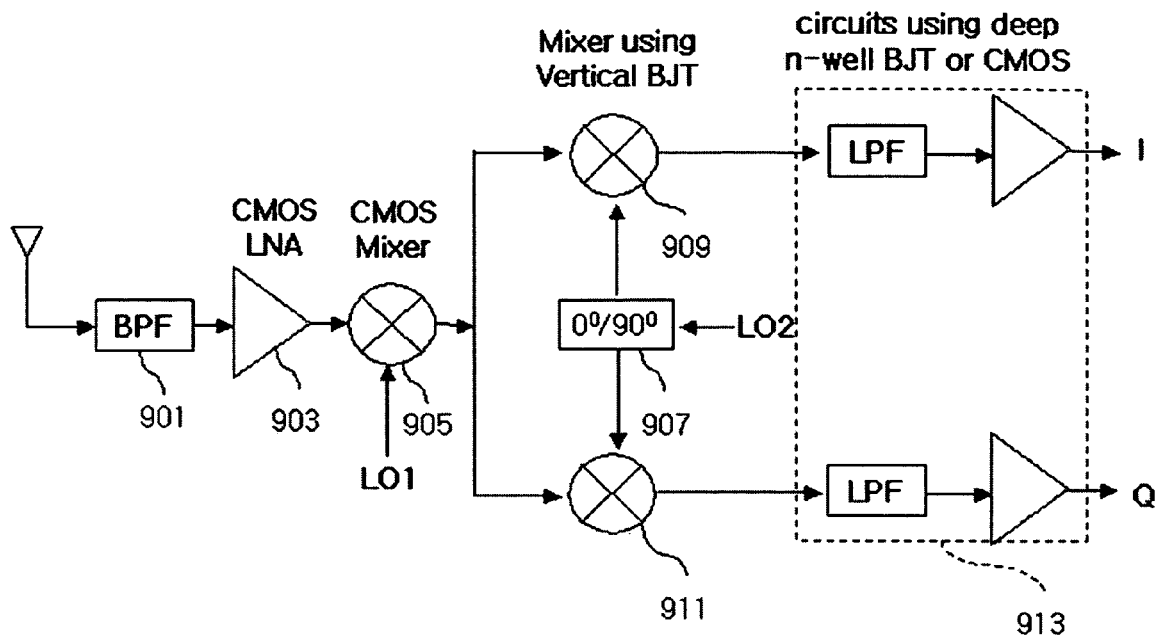
FIG. 9 shows a block diagram of a vector IF direct conversion receiver according to another embodiment of the present invention using the vertical BJT shown in FIG. 4.

FIG. 9 shows a block diagram of a vector IF direct conversion receiver according to another embodiment of the present invention using the vertical BJT shown in FIG. 4.

As shown in FIG. 9, the vector IF direct conversion receiver of another embodiment of the present invention differs from the scalar IF direct conversion receiver shown in FIG. 6 in that it further comprises phase conversion device (907) and second and third active mixer (909, 911). That is, second and third mixer (909, 911) mixes the intermediate frequency signal outputted from first mixer (905) with the same-phase local oscillating circuit outputted from phase conversion device (907) and the vertical-phase local oscillating signal, respectively to output base-band same-phase vector signal I and base-band vertical-phase vector signal Q.

Figure 10:
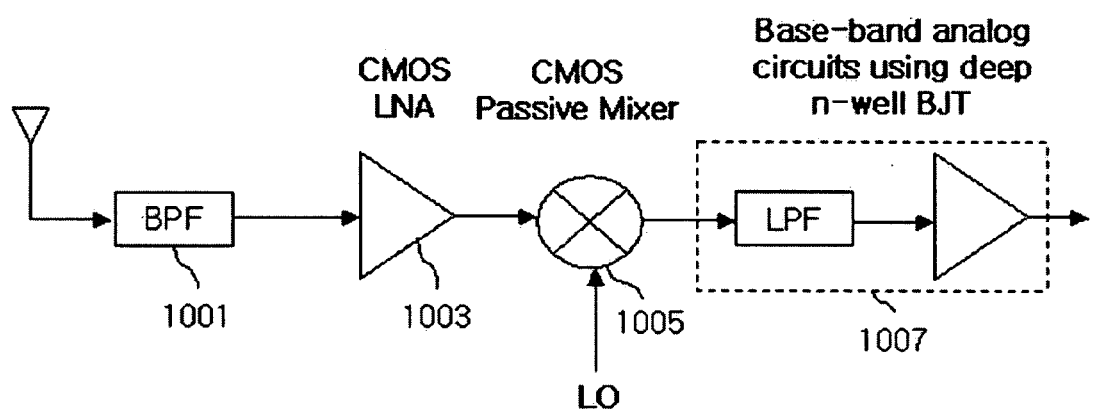
FIG. 10 shows a block diagram of scalar RF direct conversion receiver according to another embodiment of the present invention using the vertical BJT shown in FIG. 4.

FIG. 10 shows a block diagram of scalar RF direct conversion receiver according to another embodiment of the present invention using the vertical BJT shown in FIG. 4.

As shown in FIG. 10, the direct conversion receiver of another embodiment of the present invention differs from the direct conversion receiver in that CMOS passive mixer (1005) is used. That is, the direct conversion receiver shown in FIG. 10 comprises a band pass filter (1001), low noise amplifier (1003), passive mixer (1005) and base-band analog circuit (1007).

In the following, the operation of the direct conversion receiver of still other embodiment of the present invention will be described.

Band pass filter (1001) filters signal with desired band.

Low noise amplifier (1003) is embodied in CMOS process and amplifies the signal filtered through band pass filter (1001).

Mixer (1005) is a passive mixer that is embodied in CMOS process. The mixer mixes the signal amplified by low noise amplifier (1003) with local oscillating signal LO to output base-band scalar signal.

Since 1/f noise of MOS device is approximately proportional to the square of DC current, 1/f noise is not generated substantially in the event that the MOS device is used as a simple variable resistor such as a switching device of a passive mixer. Thus, 1/f noise that causes problem in a direct conversion receiver can be removed by use of the passive mixer. However, the passive mixer has no gain and has high noise characteristic. Thus, it is preferred that a low noise amplifier with high gain or a low noise amplifier with more than two stages is employed in order to obtain gain and noise characteristic required for total system. However, it should be understood that the scope of the present invention is not limited to the number of the low noise amplifier.

Base-band analog circuit (1007) comprises low pass filter and amplifier and the like. The circuit filters the base-band signal outputted from passive mixer (1005) and amplifies the signal. In the direct conversion receiver of still other embodiment of the present invention, base-band analog circuit (1007) is embodied with vertical BJT, thereby resolving problems of 1/f noise and mis-matching caused in base-band analog circuit (1007).

Figure 11:
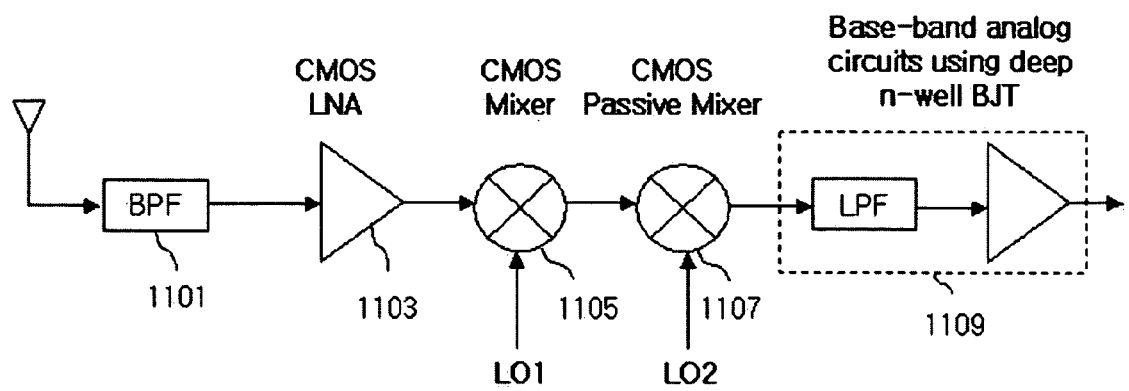
FIG. 11 shows a block diagram of scalar IF direct conversion receiver according to another embodiment of the present invention using the vertical BJT shown in FIG. 4.

FIG. 11 shows a block diagram of scalar IF direct conversion receiver according to another embodiment of the present invention using the vertical BJT shown in FIG. 4.

The IF direct conversion receiver shown in FIG. 11 differs from the direct conversion receiver shown in FIG. 10 in that it comprises first active mixer (1105) and second passive mixer (1107) that are embodied with CMOS and in that first and second local oscillating signals LO1 and LO2 are applied to first and second mixers (1105, 1107). First active mixer (1105) mixes radio frequency signal amplified by low noise amplifier (1103) with the first local oscillating signal LO1 and converts the signal into intermediate frequency signal. Second passive mixer (1107) mixes the intermediate frequency signal with the second local oscillating signal LO2 and converts the signal into base-band scalar signal. Further, in the IF direct conversion receiver of still other embodiment of the present invention, it is preferred that IF filter filtering IF band signal is provided between first active mixer (1105) and second passive mixer (1107).

Figure 12:
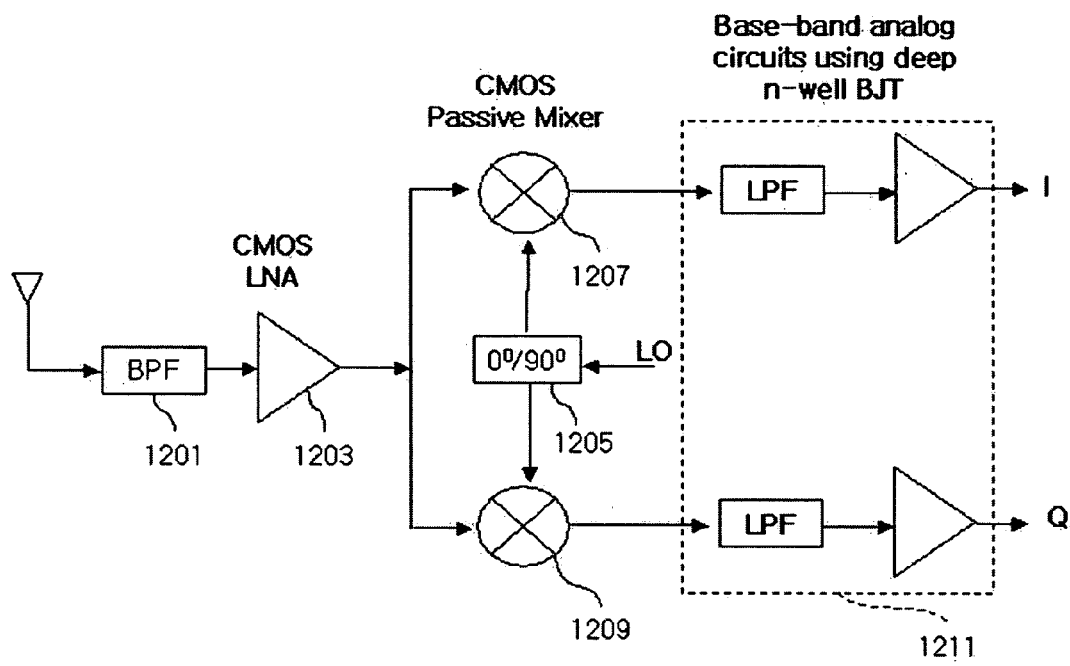
FIG. 12 shows a block diagram of a vector RF direct conversion receiver according to still other embodiment of the present invention using the vertical BJT shown in FIG. 4.

FIG. 12 shows a block diagram of a vector RF direct conversion receiver according to still other embodiment of the present invention using the vertical BJT shown in FIG. 4.

As shown in FIG. 12, the vector RF direct conversion receiver of still other embodiment of the present invention differs from the scalar direct conversion receiver shown in FIG. 10 in that it further comprises phase conversion device (120), first and second passive mixers (1207, 1209).

In the following, the operation of the direct conversion receiver of still other embodiment of the present invention will be described. Band pass filter (1201) and low noise amplifier (1203) are not described since their operation is same as described in the above.

Phase conversion device (1205) inputs local oscillating signal LO; converts the signal into same-phase local oscillating signal and vertical-phase local oscillating signal; and outputs them to first and second passive mixer (1207, 1209), respectively.

First and second passive mixer (1207, 1209) mixes the signal amplified by low noise amplifier (1203) with the signal outputted from phase conversion device (1205) to output same-phase base-band vector signal I and vertical-phase base-band vector signal Q. Since first and second mixers (1207, 1209) are passive mixers, 1/f noise does not generate substantially.

Base-band analog circuit (1211) comprises low pass filter, amplifier and the like. The circuit filters the base-band same-phase vector signal I outputted from first and second passive mixer (1207, 1209) and base-band vertical-phase vector signal Q and amplifies them. Base-band analog circuit (1211) is embodied with vertical BJT.

Figure 13:
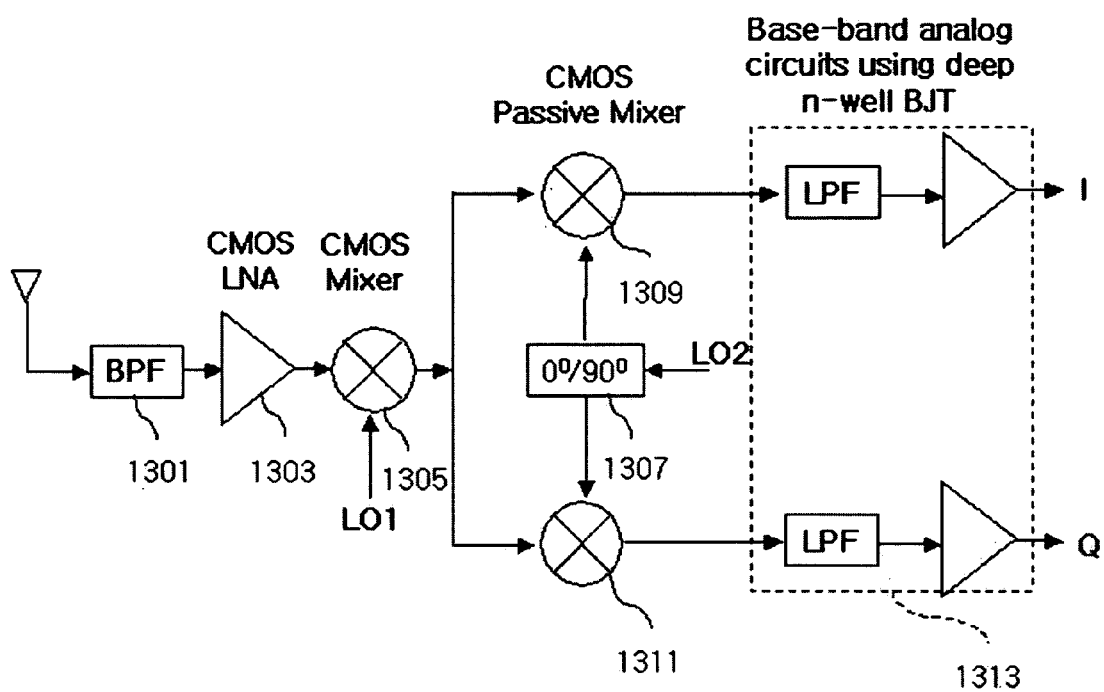
FIG. 13, shows a block diagram of a vector IF direct conversion receiver according to another embodiment of the present invention using the vertical BJT shown in FIG. 4.

FIG. 13 shows a block diagram of a vector IF direct conversion receiver according to another embodiment of the present invention using the vertical BJT shown in FIG. 4.

IF direct conversion receiver shown in FIG. 13 differs from the scalar IF direct conversion receiver shown in FIG. 11 in that it further comprises phase conversion device (1307) and second and third passive mixers (1309, 1311). That is, second and third passive mixers (1309, 1311) mixes the intermediate frequency signal outputted from first active mixer (1305) with same-phase local oscillating signal outputted from phase conversion device (1307) and vertical-phase local oscillating signal, respectively, and outputs base-band same-phase vector signal I and base-band vertical-phase vector signal Q.

INDUSTRIAL APPLICABILITY

The present invention improves DC offset, matching characteristic between I/Q signals and 1/f noise characteristic of direct conversion receiver, thereby increasing the receiving sensitivity of the receiver.

Further, the invention minimizes 1/f noise caused in mixer and base-band analog circuit, thereby making it possible that a direct conversion receiver is employed in application having narrow transceiving band.

The invention claimed is:

1. A direct conversion receiver, comprising:
a band pass filter being configured to filter a predetermined band of received signal;
a low noise amplifier being configured to amplify the signal passing said band pass filter;
an active mixer being configured to mix the signal outputted from said low noise amplifier with a local oscillating signal and outputting a scalar base-band signal, said active mixer being embodied with a vertical BJT embodied in a three layers-well CMOS process having a deep n-well; and
a base-band analog circuit being configured to filter base-band signal outputted from said active mixer and amplifying the signal,
said vertical BJT having an emitter formed in an n+ source-drain process of said CMOS process, a base formed in a p-well of said CMOS process and a p+ source-drain diffusion, and a collector formed in said deep n-well of said CMOS process, an n-well, and an n+ source-drain diffusion.

2. The direct conversion receiver of claim 1, wherein said low noise amplifier employs an MOS transistor embodied in said CMOS process.

3. The direct conversion receiver of claim 1, wherein said low noise amplifier is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well, and n+ source-drain diffusion.

4. The direct conversion receiver of claim 1, wherein said base-band analog circuit employs an MOS transistor embodied in said CMOS process.

5. The direct conversion receiver of claim 1, wherein said base-band analog circuit is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well, and n+ source-drain diffusion.

6. A direct conversion receiver, comprising:
a band pass filter being configured to filter a predetermined band of received signal;
a low noise amplifier being configured to amplify the signal passing said band pass filter;
a phase conversion device being applied with a local oscillating signal being configured to output a same-phase local oscillating signal and vertical phase local oscillating signal;
first and second active mixers being configured to mix the signal outputted from said low noise amplifier with a same-phase local oscillating signal and a vertical-phase local oscillating signal outputted from said phase conversion device and respectively outputting said same-phase base-band vector signal and said vertical base-band vector signal, said active mixers being embodied with a vertical BJT embodied in a three layers-well CMOS process having a deep n-well; and
a base-band analog circuit being configured to filter said base-band signals outputted from said first and second active mixer and amplifying the signal,
said vertical BJT having an emitter formed in an n+ source-drain process of said CMOS process, a base formed in a p-well of said CMOS process and p+ source-drain diffusion, and a collector formed in said deep n-well of said CMOS process, an n-well, and an n+ source-drain diffusion.

7. The direct conversion receiver of claim 6, wherein said low noise amplifier employs an MOS transistor embodied in said CMOS process.

8. The direct conversion receiver of claim 6, wherein said low noise amplifier is embodied with said vertical BJT embodied in said CMOS process having said deep n-well having emitter formed in said n+ source-drain diffusion of said CMOS process, said base formed in said p-well of said CMOS process and said p+ source-drain diffusion, and a collector formed in said deep n-well of said CMOS process, n-well, and n+ source-drain diffusion.

9. The direct conversion receiver of claim 6, wherein said base-band analog circuit employs an MOS transistor embodied in said CMOS process.

10. The direct conversion receiver of claim 6, wherein said base-band analog circuit is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well, and n+ source-drain diffusion.

11. A direct conversion receiver, comprising:
   a band pass filter being configured to filter a predetermined band of received signal;
   a low noise amplifier being configured to amplify the signal passing said band pass filter;
   a first active mixer being configured to mix the signal outputted from said low noise amplifier with a first local oscillating signal and outputting an intermediate frequency signal;
   a second active mixer being configured to mix the intermediate frequency signal outputted from said first active mixer with a second local oscillating signal and outputting a base-band scalar signal, said second active mixer being embodied with a vertical BJT embodied in a three layers-well CMOS process having a deep n-well; and
   a the base-band analog circuit being configured to filter base-band signal outputted from said second active mixer and amplifying the signal,
   said vetical BJT having an emitter formed in an n+ source-drain process of said CMOS process, a base formed in a p-well of said CMOS process and a p+ source-drain diffusion, and a collector formed in said deep n-well of said CMOS process, an n-well, and an n+ source-drain diffusion.

12. The direct conversion receiver of claim 11, wherein said low noise amplifier employs an MOS transistor embodied in said CMOS process.

13. The direct conversion receiver of claim 11, wherein said low noise amplifier is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well and n+ source-drain diffusion.

14. The direct conversion receiver of claim 11, wherein said base-band analog circuit employs an MOS transistor embodied in said CMOS process.

15. The direct conversion receiver of claim 11, wherein said base-band analog circuit is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, an n-well, and an n+ source-drain diffusion.

16. A direct conversion receiver, comprising:
   a band pass filter being configured to filter a predetermined band of received signal;
   a low noise amplifier being configured to amplify the signal passing said band pass filter;
   a first active mixer being configured to mix the signal outputted from said low noise amplifier with a first local oscillating signal and outputting an intermediate frequency signal;
   a phase conversion device being applied with a second local oscillating signal being configured to output a same-phase local oscillating signal and a vertical-phase local oscillating signal;
   second and third active mixers being configured to mix said intermediate frequency signal outputted from said first active mixer with said same-phase local and said vertical-phase local oscillating signal and outputting a same-phase base-band vector signal and a vertical-phase base-band vector signal oscillating signal outputted from said phase conversion device, said second and third active mixers being embodied with a vertical BJT embodied in a three layers-well CMOS process having a deep n-well; and
   a base-band analog circuit being configured to filter said base-band signal outputted from said second active mixer and amplifying the signal,
   said vertical BJT having an emitter formed in a n+ source-drain process of said CMOS process, a base formed in a p-well of said CMOS process and a p+ source-drain diffusion, and a collector formed in said deep n-well of said CMOS process, an n-well, and an n+ source-drain diffusion.

17. The direct conversion receiver of claim 16, wherein said low noise amplifier employs an MOS transistor embodied in said CMOS process.

18. The direct conversion receiver of claim 16, wherein said low noise amplifier is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well and n+ source-drain diffusion.

19. The direct conversion receiver of claim 16, wherein said base-band analog circuit employs an MOS transistor embodied in said CMOS process.

20. The direct conversion receiver of claim 16, wherein said base-band analog circuit is embodied with said vertical BJT embodied in said CMOS process having said deep n-well having said emitter formed in said n+ source-drain diffusion of said CMOS process, said base formed in said p-well of said CMOS process and said p+ source-drain diffusion, and said collector formed in said deep n-well of said CMOS process, n-well, and n+ source-drain diffusion.

21. A direct conversion receiver, comprising:
   a band pass filter being configured to filter a predetermined band of received signal;
   a low noise amplifier being configured to amplify the signal passing said band pass filter;
   a passive mixer being configured to convert a radio frequency signal outputted from said low noise amplifier to a base-band scalar signal; and
   a base-band analog circuit being configured to filter said base-band scalar signal outputted from said passive mixer and amplifying the signal, said circuit being embodied with a vertical BJT embodied in a three layers-well CMOS process having a deep n-well,
   said vertical BJT having an emitter formed in an n+ source-drain process of said CMOS process, a base formed in a p-well of said CMOS process and a p+ source-drain diffusion, and a collector formed in said deep n-well of said CMOS process, n-well and n+ source-drain diffusion.

22. The direct conversion receiver of claim 21, wherein said low noise amplifier employs an MOS transistor embodied in said CMOS process.

23. The direct conversion receiver of claim 21, wherein said passive mixer is embodied in said CMOS process.

24. A direct conversion receiver, comprising:
   a band pass filter being configured to filter a predetermined band of received signal;

a low noise amplifier being configured to amplify the signal passing said band pass filter;

a phase conversion device being applied with a local oscillating signal being configured to output a same-phase local oscillating signal and a vertical-phase local oscillating signal;

first and second passive mixers being configured to mix a radio frequency signal outputted from said low noise amplifier with the same-phase local oscillating signal and the vertical-phase local oscillating signal and respectively outputting a same-phase base-band vector signal and a vertical-phase base-band vector signal; and a base-band analog circuit being configured to filter the base-band signal outputted from said first and second passive mixers and amplifying the signal, said circuit being embodied with a vertical BJT embodied in a three layers-well CMOS process having a deep n-well, said vertical BJT having an emitter formed in an n+ source-drain process of said CMOS process, a base formed in a p-well of said CMOS process and a p+ source-drain diffusion, and a collector formed in said deep n-well of said CMOS process, n-well, and n+ source-drain diffusion.

25. The direct conversion receiver of claim 24, wherein said low noise amplifier employs an MOS transistor embodied in said CMOS process.

26. The direct conversion receiver of claim 24, wherein said first and second passive mixers are embodied in said CMOS process.

27. A direct conversion receiver, comprising:

a band pass filter being configured to filter a predetermined band of received signal;

a low noise amplifier being configured to amplify the signal passing said band pass filter;

a first active mixer being configured to mix a radio frequency signal outputted from said low noise amplifier with a first local oscillating signal and outputting an intermediate frequency signal;

a second passive mixer being configured to mix the intermediate frequency signal outputted from said first active mixer with a second local oscillating signal and outputting a base-band scalar signal; and a the base-band analog circuit being configured to filter base-band signal outputted from said first and second passive mixers and amplifying the signal, said circuit being embodied with a vertical BJT embodied in a three layers-well CMOS process having a deep n-well, said vertical BJT having an emitter formed in an n+ source-drain process of said CMOS process, a base formed in a p-well of said CMOS process and a p+ source-drain diffusion, and a collector formed in said deep n-well of said CMOS process, an n-well, and n+ source-drain diffusion.

28. The direct conversion receiver of claim 27, wherein said low noise amplifier employs an MOS transistor embodied in said CMOS process.

29. The direct conversion receiver of claim 27, wherein said second passive mixer is embodied in said CMOS process.

30. A direct conversion receiver, comprising:

a band pass filter being configured to filter a predetermined band of received signal;

a low noise amplifier being configured to amplify the signal passing said band pass filter;

a first active mixer being configured to mix a radio frequency signal outputted from said low noise amplifier with a first local oscillating signal and outputting an intermediate frequency signal;

a phase conversion device being applied with a second local oscillating signal being configured to output a same-phase local oscillating signal and a vertical-phase local oscillating signal;

second and third passive mixers being configured to mix the intermediate frequency signal outputted from said first active mixer with the same-phase base-band vector signal and vertical-phase local oscillating signal outputted from said phase conversion device and respectively outputting a same-phase base-band vector signal and a vertical-phase base-band signal; and a the base-band analog circuit being configured to filter the base-band signal outputted from said first and second passive mixers and amplifying the signal, said circuit being embodied with a vertical BJT embodied in a three layers-well CMOS process having a deep n-well, said vertical BJT having an emitter formed in an n+ source-drain process of said CMOS process, a base formed in a p-well of said CMOS process and a p+ source-drain diffusion, and a collector formed in said deep n-well of said CMOS process, n-well, and n+ source-drain diffusion.

31. The direct conversion receiver of claim 30, wherein said low noise amplifier employs an MOS transistor embodied in said CMOS process.

32. The direct conversion receiver of claim 27, wherein said second and third passive mixer are embodied in said CMOS process.

* * * * *